United States Patent
Wang

(10) Patent No.: US 10,837,988 B2
(45) Date of Patent: Nov. 17, 2020

(54) CORRECTION METHOD, CORRECTION DEVICE, AND DISPLAY DEVICE

(71) Applicants: CHONGQING HKC OPTOELECTRONICS TECHNOLOGY CO., LTD., Chongqing (CN); HKC CORPORATION LIMITED, Guangdong (CN)

(72) Inventor: Mingliang Wang, Chongqing (CN)

(73) Assignees: Chongqing HKC Optoelectronics Technology Co., Ltd., Chongqing (CN); HKC Corporation Limited, Guangdong (CN)

(*) Notice: Subject to any disclaimer, the term of this patent is extended or adjusted under 35 U.S.C. 154(b) by 28 days.

(21) Appl. No.: 16/313,755

(22) PCT Filed: Nov. 1, 2018

(86) PCT No.: PCT/CN2018/113398
§ 371 (c)(1),
(2) Date: Dec. 27, 2018

(87) PCT Pub. No.: WO2020/042341
PCT Pub. Date: May 3, 2020

(65) Prior Publication Data
US 2020/0072877 A1    Mar. 5, 2020

(30) Foreign Application Priority Data
Aug. 31, 2018 (CN) .......................... 2018 1 1013646

(51) Int. Cl.
G09G 3/32      (2016.01)
G01R 19/165    (2006.01)
(Continued)

(52) U.S. Cl.
CPC .......... *G01R 19/165* (2013.01); *G05F 1/575* (2013.01); *G09G 3/3225* (2013.01); *G09G 3/3648* (2013.01)

(58) Field of Classification Search
CPC .... G01R 19/165; G05F 1/575; G09G 3/3225; G09G 3/3648; G09G 3/32
See application file for complete search history.

(56) References Cited

U.S. PATENT DOCUMENTS 6,947,272 B2   9/2005   Daniels et al.
9,871,443 B2   1/2018   Lin
(Continued)

FOREIGN PATENT DOCUMENTS

CN    1599172 A      3/2005
CN    101931206 A    12/2010
(Continued)

OTHER PUBLICATIONS

International Search Report, dated May 9, 2019, for Chongqing Huike Jinyu Optoelectronic Technology Co., Ltd. et al., International Application No. PCT/CN2018/113398, Filed Nov. 1, 2019.
(Continued)

*Primary Examiner* — Pegeman Karimi
(74) *Attorney, Agent, or Firm* — Westbridge IP LLC

(57) ABSTRACT

The present application provides a correction method, a correction device, and a display device. By detecting a current value of a current signal output by a chip, in case that the current value is smaller than an initial over current set value of the chip, the overcurrent set value of the chip will be corrected, such that the overcurrent set value in the chip can be modulated according to the current value of the current signal output by the chip, and it is avoided the problem that the panel with relatively small operating cur-
(Continued)

rent is unable to trigger the current limiting protection and would cause the abnormal display or burnout.

18 Claims, 3 Drawing Sheets

(51) Int. Cl.
*G09G 3/3225* (2016.01)
*G09G 3/36* (2006.01)
*G05F 1/575* (2006.01)

(56) References Cited

U.S. PATENT DOCUMENTS

| | | |
|---|---|---|
| 10,116,131 B2 | 10/2018 | Zhang |
| 2003/0095368 A1 | 5/2003 | Daniels et al. |
| 2016/0170425 A1 | 6/2016 | Lin |
| 2017/0294154 A1* | 10/2017 | Takeuchi ......... G01R 19/16533 |
| 2018/0097350 A1* | 4/2018 | Zhang ................... G02F 1/1333 |
| 2020/0013333 A1* | 1/2020 | Hwang ................ G09G 3/3275 |

FOREIGN PATENT DOCUMENTS

| | | |
|---|---|---|
| CN | 102074928 A | 5/2011 |
| CN | 104518477 A | 4/2015 |
| CN | 105790206 A | 7/2016 |
| CN | 205566093 U | 9/2016 |
| CN | 106208694 A | 12/2016 |
| CN | 106786344 A | 5/2017 |
| JP | H11355960 A | 12/1999 |
| JP | 3487403 B2 | 1/2004 |

OTHER PUBLICATIONS

Written Opinion, dated May 9, 2019, for Chongqing Huike Jinyu Optoelectronic Technology Co., Ltd. et al., International Application No. PCT/CN2018/113398, Filed Nov. 1, 2019.
Chinese Office Action, Apr. 28, 2019, for Chongqing Huike Jinyu Optoelectronic Technology Co., Ltd. et al., Application No. 201811013646.8.

* cited by examiner searching a table of correspondence relation between a pre-stored current value and the overcurrent set value to acquire the overcurrent set value corresponding to the current value of the current signal

↓ correcting the overcurrent set value of the chip to the overcurrent set value corresponding to the current value of the current signal

FIG. 3

| current value of current signal (mA) | overcurrent set value (mA) |
|---|---|
| 70 | 100 |
| 60 | 100 |
| 50 | 90 |
| 40 | 80 |
| 30 | 70 |
| 20 | 60 |

FIG. 4

CORRECTION METHOD, CORRECTION DEVICE, AND DISPLAY DEVICE

CROSS-REFERENCE TO RELATED APPLICATIONS

This application is the International Application No. PCT/CN2018/113398 for entry into US national phase with an international filing date of Nov. 1, 2018, designating US, now pending, and claims priority to Chinese Patent Application No. 201811013646.8, filed on Aug. 31, 2018, the content of which is incorporated herein by reference in its entirety.

BACKGROUND OF THE INVENTION

Field of the Invention

The present application relates to the electronic technical field, and more particularly to a correction method, a correction device, and a display device.

Description of Related Art

In a traditional liquid crystal display panel, a gate driver IC is usually integrated into the display panel, which greatly limits the reduction of the display frame. In order to reduce the frame of the display, a gate driver less (GDL) configuration is generally adopted by the existing display. The GDL circuit divides the gate driver IC into a level shifter IC and a shift register IC, the level shifter IC is integrated into the driver board, and the shifter register IC is integrated into the display panel. The level shifter IC outputs a high voltage logic signal to the shift register IC to complete the driving of the display, thereby further reducing the length of the frame. The display panel may work abnormally due to the uncontrollable factors in the manufacturing process, and in order to avoid the currents output by the level shifter IC and the power management IC from being too large and burning the display panel, the level shifter IC and the power management IC are usually provided with protection mechanisms, such that current output of the level shifter IC can be shutdown in case of a too large current signal output by the level shifter IC, or the current output of the power management IC can be shutdown in case of a too large current signal output by the power management IC.

Due to the deviation in the panel manufacturing process, the current status of each panel is different. The chips inside the existing panel usually adopt the same current protection value, which may make the panel with small operating current unable to trigger the current limiting protection and cause abnormal display or burnout.

BRIEF SUMMARY OF THE INVENTION

It is an object of the present application to provide a correction method, a correction device, and a display device, which aims at solving the technical problem, comprising but not limited to, that due to the deviation in the panel manufacturing process, the current status of each panel is different, and the chips inside the existing panel usually adopt the same current protection value, which may make the panel with small operating current unable to trigger the current limiting protection and cause abnormal display or burnout.

In order to solve the above technical problems, the following technical problem is adopted by the present application:

The present application provides a correction method. The correction method comprises:
detecting a current value of a output current signal of a chip;
determining whether or not the current value is smaller than a first preset threshold; and
correcting an overcurrent set value of the chip to a second preset threshold corresponding to the current value according to a preset current conversion relation if the current value is smaller than the first preset threshold, in which, the first preset threshold is an initial overcurrent set value of the chip, and the second preset threshold is no greater than the first preset threshold; or
maintaining the initial overcurrent set value constant if the current value is no smaller than the first preset threshold.

In one embodiment, the preset current conversion relation comprises:
setting the second preset threshold to be the current value of the current signal output by the chip plus a preset value.

In one embodiment, the preset current conversion relation comprises:
setting the second preset threshold to be 1.1 folds or 1.2 folds of the current value of the current signal output by the chip.

In one embodiment, the preset current conversion relation comprises:
setting the second preset threshold which is in correspondence with the current value of the current signal output by the chip in a pre-stored current lookup table.

In one embodiment, the operation of correcting the overcurrent set value of the chip to the second preset threshold corresponding to the current value according to the preset current conversion relation comprises:
determining a threshold interval where the current value is located; and
acquiring the overcurrent set value corresponding to the threshold interval, and correcting the overcurrent set value of the chip to the overcurrent set value corresponding to the threshold interval.

In one embodiment, if the threshold interval where the current value of the current signal is located is a preset safety threshold interval, the correction of the initial overcurrent set value of the chip is skipped.

In one embodiment, the operation of detecting the current value of the current signal output by the chip comprises:
converting the current signal into a digital signal to obtain the current value of the current signal.

In one embodiment, the operation of correcting the overcurrent set value of the chip to the second preset threshold corresponding to the current value according to the preset current conversion relation comprises:
searching a table of correspondence relation between a pre-stored current value and the overcurrent set value to acquire the overcurrent set value corresponding to the current value of the current signal; and
correcting the overcurrent set value of the chip to the overcurrent set value corresponding to the current value of the current signal.

In one embodiment, the operation of maintaining the initial overcurrent set value of the chip constant further comprises:
controlling the chip to stop outputting the current signal.

It is another object of the invention to provide a correction device. The correction device comprises:
a current detector, configured to detect a current value of a output current signal of a chip;

a current comparator, configured to determine whether or not the current value is smaller than a first preset threshold;

an overcurrent set circuit, configured to correct an overcurrent set value of the chip to a second preset threshold corresponding to the current value of the current signal according to a preset current conversion relation when the current value is smaller than the first preset threshold, in which, the first preset threshold is an initial overcurrent set value of the chip, and the second preset threshold is no greater than the first preset threshold; and a controller, configured to maintain the initial overcurrent set value constant when the current value is no smaller than the first preset threshold.

In one embodiment, the preset current convention relation comprises:

setting the second preset threshold to be the current value of the current signal output by the chip plus a preset value.

In one embodiment, the preset current convention relation comprises:

setting the second preset threshold to be 1.1 folds or 1.2 folds of the current value of the current signal output by the chip.

In one embodiment, the preset current convention relation comprises:

setting the second preset threshold which is in correspondence with the current value of the current signal output by the chip in a pre-stored current lookup table.

In one embodiment, the overcurrent set circuit comprises:

a comparator cell, configured to determine a threshold interval where the current value is located when the current value is smaller than the first preset threshold; and a correction cell, configured to acquire the overcurrent set value corresponding to the threshold interval and correct the overcurrent set value of the chip to the overcurrent set value corresponding to the threshold interval.

In one embodiment, the correction cell is further configured to skip the correction of the initial overcurrent set value of the chip when the threshold interval where the current value is located is a preset safety threshold interval.

In one embodiment, the current detector is further configured to convert the current signal into a digital signal to obtain the current value of the current signal.

In one embodiment, the overcurrent set circuit is further configured to:

search a table of correspondence relation between a pre-stored current value and the overcurrent set value when the current value is smaller than the first preset threshold, acquire the overcurrent set value corresponding to the current value of the current signal, and correct the overcurrent set value of the chip to the overcurrent set value corresponding to the current value of the current signal.

In one embodiment, the controller is further configured to:

control the chip to stop outputting the current signal when the current value of the current signal is no smaller than the first preset threshold.

In one embodiment, the controller is further configured to:

control the chip to stop outputting the current signal when the current value of the current signal is no smaller than the initial overcurrent set value.

It is still another object of the present application to provide a display device. The display device comprises:

a display panel;

a driver circuit; and a correction device;

the driver circuit comprises a level shifter IC configured to output a current signal, and the display panel is provided with a shifter register configured to receive a current output signal output from the level shifter IC for diving the display panel; and the correction device comprises:

a current detector, configured to detect a current value of a output current signal of a chip;

a current comparator, configured to determine whether or not the current value is smaller than a first preset threshold;

an overcurrent set circuit, configured to correct an overcurrent set value of the chip to a second preset threshold corresponding to the current value of the current signal according to a preset current conversion relation when the current value is smaller than the first preset threshold, in which, the first preset threshold is an initial overcurrent set value of the chip, and the second preset threshold is no greater than the first preset threshold; and a controller, configured to maintain the initial overcurrent set value constant when the current value is no smaller than the first preset threshold.

The embodiments of the present application provide a correction method, a correction device, and a display device. The current value of the current signal output by the chip is detected, when the current value is smaller than the first preset threshold, the overcurrent set value of the chip is corrected to the second preset threshold corresponding to the current value of the current signal according to the preset current conversion relation, of which, the first preset threshold is the initial overcurrent set value of the chip, and the second preset threshold is smaller than or equal to the first preset threshold. In this way, the overcurrent set value in the chip can be modulated according to the current value of the current signal output by the chip, and it is realizes the purpose that the current signal output by the chip can be timely shutdown in case of overcurrent, thus solving the problem that the current status of each panel is different due to the deviation in the panel manufacturing process, and the chips inside the existing panel usually adopt the same current protection value, which may make the panel with small operating current unable to trigger the current limiting protection and cause abnormal display or burnout.

BRIEF DESCRIPTION OF THE DRAWINGS

In order to more clearly illustrate the technical solution in embodiments of the present application, the following drawings, which are to be used in the description of the embodiments or the existing techniques, will be briefly described. It will be apparent that the drawings described in the following description are merely embodiments of the present application. Other drawings may be obtained by those skilled in the art without paying creative labor.

FIG. 3 is a schematic flowchart of a correct method according to one embodiment of the present application;

FIG. 4 is a table of correspondence between a pre-stored current value and an overcurrent set value according to one embodiment of the present application;

DETAILED DESCRIPTION OF THE EMBODIMENTS

In order to make those skilled in the art better understood the technical solutions of the present application, technical solutions in embodiments of the present application are clearly described hereinbelow with reference to accompanying drawings in the embodiments of the present application. Obviously, the described embodiments are only a part of embodiments of the present application, rather than all the embodiments. All other embodiments obtained by those skilled in the art based on the embodiments of the present application without creative efforts shall fall within the protection scope of the present application.

Terms "comprising" and variations thereof in description, claims, and the drawings of the present application are intended to cover non-exclusive inclusion. For example, a process, a method, a system, a product, or a device that includes a series of steps or cells is not limited to the steps or the cells listed, but may optionally include steps or cells not listed, or may optionally include other inherent steps or cells for the process, the method, the product, or the device. In addition, terms "first", "second", "third", and the like are used to distinguish different objects, rather than to describe a particular order.

In a Gate Driver Less (GDL) configuration, a gate driver less circuit divides the conventional gate driver IC into a level shifter IC and a shift register IC, in which, the level shifter IC is integrated into a driver board, the shift register IC is integrated into a display panel, and the level shifter IC outputs a clock signal to the shift register IC to complete the driving of the display driver, thereby further reducing the length of the frame and continuously increasing the effective display region. In order to protect the chips from being burnt in case of an overcurrent of an output signal, an internal protection mechanism is usually provided inside the respective chip. For example, the power management IC is configured to convert the voltage input from a power supply into various types of voltage signals for output, in the display device, the voltage signal output by the power management IC includes: a turn-on voltage signal (VGH) configured to turn on a thin film transistor (TFT), and a turn-off voltage signal (VGL) configured to turn off the TFT, etc., in order to avoid the display panel from being burnt, and generally a power management signal is provided therein with an overcurrent protection mechanism. The level shifter IC is configured to boost the voltage of an input low voltage logic signal and output a high voltage logic signal. In order to avoid the voltage value of the high voltage logic signal produced in the voltage boosting process from being too high, an output terminal of the level shifter IC is always provided with an overvoltage protection mechanism, which is configured to turn off the output signal when the output of the high voltage logic signal is an overvoltage.

Figure 1:
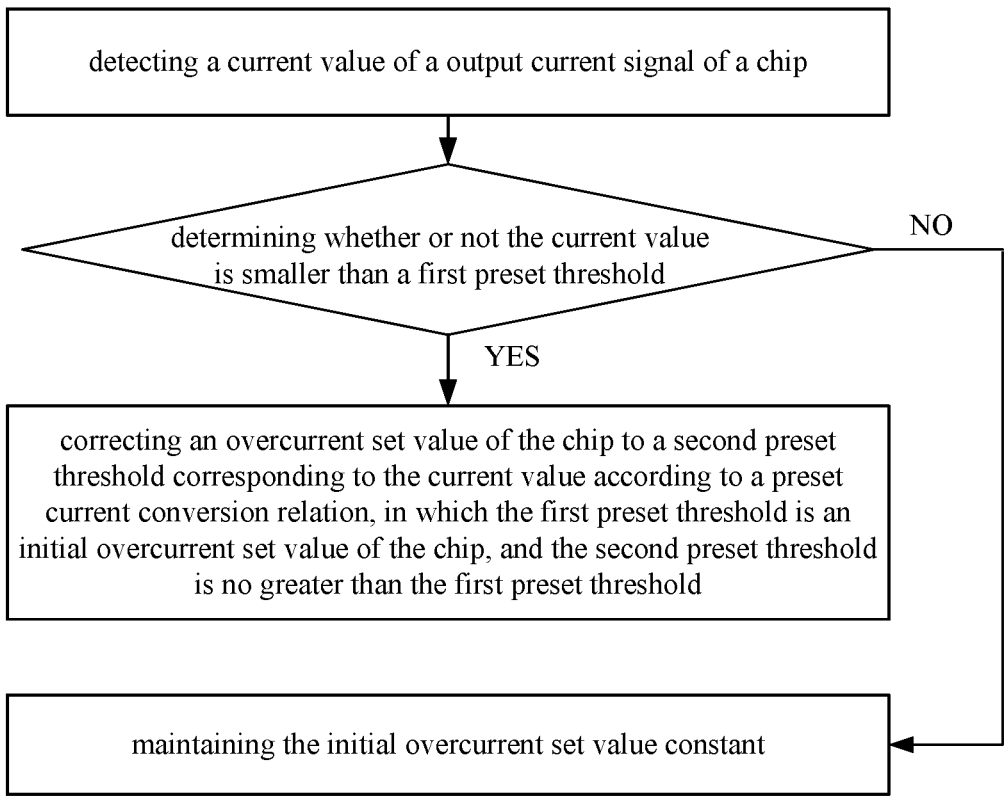
FIG. 1 is a schematic flow chart of a correction method according to one embodiment of the present application.

FIG. 1 is a schematic flowchart of a correction method provided by one embodiment of the present application.

As shown in FIG. 1, the correction method of the present embodiment comprises:

detecting a current value of a output current signal of the chip; and

In one embodiment, the current value of the output current signal of the chip is detected, and the detection includes an acquisition process and a conversion process, that is, the acquired current signal is converted into a voltage value.

determining whether or not the current value is smaller than a first preset threshold; and correcting an overcurrent set value of the chip to a second preset threshold corresponding to the current value according to a preset current conversion relation if the current value is smaller than the first preset threshold, in which, the first preset threshold is an initial overcurrent set value of the chip, and the second preset threshold is no greater than the first preset threshold; or, maintaining the initial overcurrent set value constant if the current value is no smaller than the first preset threshold.

In one embodiment, the correction method is adapted to correct the overcurrent set value of the chip. Particularly, the detected current value is compared with the first preset threshold in their magnitudes, and the first preset threshold can be set according to the user's need. If the current value is smaller than the first preset threshold, the overcurrent set value of the chip is corrected to the second preset threshold corresponding to the current value according to the preset current conversion relation. The first preset threshold is the initial overcurrent set value of the chip, and the second preset threshold is no greater than the first preset threshold.

In one embodiment, when the current value is detected to be smaller than the first preset threshold, the overcurrent set value of the chip is corrected to the second preset threshold corresponding to the current value according to the preset current conversion relation. Particularly, the first preset threshold is the initial overcurrent set value of the chip. The actual overcurrent value of the chip may be different due to deviation of the manufacturing process, but the respective chip is provided with a unified initial overcurrent set value at the factory, and generally, the initial overcurrent set value is relatively large. Therefore, the second preset threshold after correction is not greater than the first preset threshold. When the current signal outputted by the chip is relatively small, the actual overcurrent value of the chip may be relatively small. The actual overcurrent value is an overcurrent value, which would result in damage once being exceeded by the current output by the chip.

In one embodiment, when the current value of the current signal output by the chip is smaller than the first preset threshold, the overcurrent set value of the chip will be corrected to the second preset threshold corresponding to the current value according to the preset current conversion relation. Particularly, the preset current conversion relation can be set according to user's needs.

In one embodiment, the preset current conversion relation may be: setting the second preset threshold to be the current value of the current signal output by the chip plus a preset value. For example, if the first preset threshold is 100 mA, the detected current value of the current signal is 10 mA, and the preset value set by the user is 20 mA, then the second preset threshold will be 30 mA according to the preset current conversion relation.

In one embodiment, the preset current conversion relation may also be a linear relation. For example, when the current value of the current signal is smaller than the first preset threshold, the second preset threshold is set to be 1.1 folds or 1.2 folds of the current value.

In one embodiment, the preset current conversion relation may also be calculated by a preset algorithm according to the user's needs, or may comprise setting the second preset threshold which is in correspondence with the current value of the current signal output by the chip in a pre-stored current lookup table.

If the current value is no smaller than the first preset threshold, the initial overcurrent set value of the chip is maintained constant.

In one embodiment, if the current value of the current signal output by the chip is no smaller than the first preset threshold, the initial overcurrent set value of the chip is maintained constant.

Figure 2:
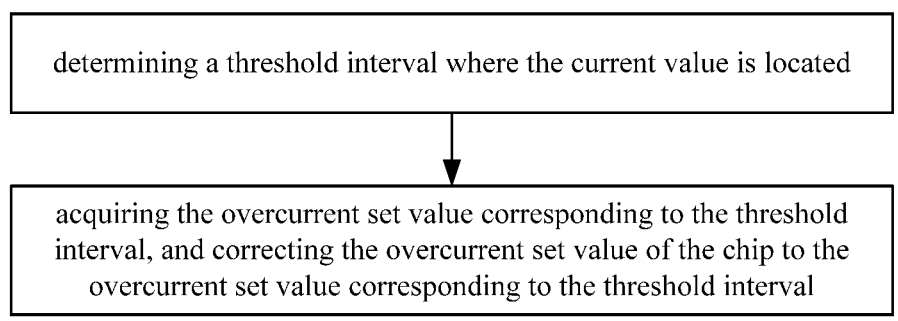
FIG. 2 is a schematic flow chart of a correction method according to one embodiment of the present application.

FIG. 2 is a schematic flowchart of a correction method provided by another embodiment of the present application.

As shown in FIG. 2, the operation of correcting the overcurrent set value of the chip to the second preset threshold corresponding to the current value according to the preset current conversion relation comprises:

determining a threshold interval where the current value is located; and acquiring the overcurrent set value corresponding to the threshold interval, and correcting the overcurrent set value of the chip to the overcurrent set value corresponding to the threshold interval.

In one embodiment, when the current value of the current signal output by the chip is smaller than the first preset threshold, the threshold interval where the current value is located is determined. For example, the first preset threshold is 100 mA, each threshold interval is defined by an interval of 10 mA, and therefore 10 threshold intervals are divided from 0 to 100 mA, the ten threshold intervals may correspond to 10 second preset thresholds which may be identical or different. For example, all the second preset thresholds corresponding to the threshold intervals of between 70 mA and 80 mA, between 80 mA and 90 mA, and between 90 mA and 100 mA may be 100 mA, the second preset threshold corresponding to the threshold interval of between 50 mA and 60 mA may be 80 mA, and so on. When the current of the current signal is detected to be smaller than the first preset threshold, the threshold interval where the current value is located is determined, for example, if the current of the current signal is detected to be 55 mA, then the overcurrent set value of the chip is corrected to 80 mA according to that the second preset threshold corresponding to the threshold interval of between 50 mA and 60 mA is 80 mA.

In one embodiment, if the threshold interval where the current value of the current signal is located is a preset safety threshold interval, the correction of the initial overcurrent set value of the chip is skipped. For example, the preset safety threshold interval is between 60 mA and 100 mA, when the detected current signal is 70 mA, the initial overcurrent set value of the chip will not be corrected.

In one embodiment, the operation of detecting the current value of the current signal output by the chip comprises:

converting the current signal into a digital signal to obtain the current value of the current signal.

In one embodiment, the detection of the current value of the current signal output by the chip may comprise the acquisition process and conversion process. When the current signal output by the chip is acquired, the current signal of the current signal is obtained by converting the current signal into the digital signal, so as to be compared with the pre-stored first current threshold.

FIG. 3 is a schematic flowchart of a correction method provided by another embodiment of the present application.

As shown in FIG. 3, the operation of correcting the overcurrent set value of the chip to the second preset threshold corresponding to the current value according to the preset current conversion relation comprises:

searching a table of correspondence relation between a pre-stored current value and the overcurrent set value to acquire the overcurrent set value corresponding to the current value of the current signal.

FIG. 4 is a table of correspondence relation between the pre-stored current value and the overcurrent set value provided by one embodiment of the present application.

In the present embodiment, FIG. 4 is the preset current conversion relation in the present embodiment, that is, a current lookup table preset by the user. Particularly, the user presets overcurrent set values corresponding to the current values that are smaller than the first preset threshold. When the current value of the current signal output by the chip is detected, the overcurrent set value corresponding to the current value is acquired based on the current value and the table of correspondence relation between the current value of the current signal and the overcurrent set value. The table of correspondence relation between the current value of the current signal and the overcurrent set value can be stored in a storage medium, and the corresponding acquisition process may be the reading of the overcurrent set value corresponding to the current value in the storage medium.

The overcurrent set value of the chip is corrected to the overcurrent set value corresponding to the current value of the current signal.

In one embodiment, after the overcurrent set value corresponding to the current value is acquired, the acquired overcurrent set value is set to be the overcurrent set value of the chip, that is, the initial overcurrent set value of the chip is corrected to the acquired overcurrent set value corresponding to the current value.

In one embodiment, the operation of maintaining the initial overcurrent set value of the chip constant further comprises:

controlling the chip to stop outputting the current signal.

In one embodiment, if the current value of the current signal is detected to be greater than the initial overcurrent set value, the chip is controlled to stop outputting the current signal.

Figure 5:
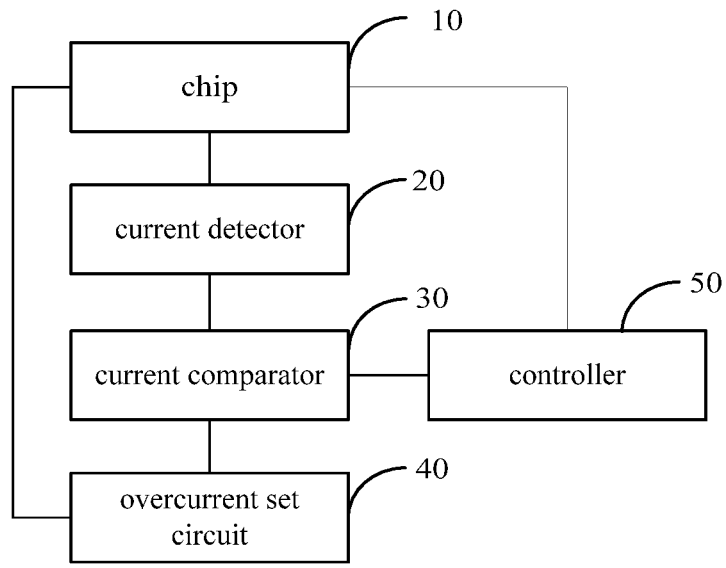
FIG. 5 is a schematic structural diagram of a correction method according to an embodiment of the present application.

FIG. 5 is a structural schematic diagram of a correction device provided by one embodiment of the present application.

As shown in FIG. 5, the correction device of the present embodiment comprises:

a current detector 20, configured to detect a current value of a output current signal of a chip; a current comparator 30, configured to determine whether or not the current value is smaller than a first preset threshold;

an overcurrent set circuit 40, configured to correct an overcurrent set value of the chip to a second preset threshold corresponding to the current value of the current signal according to a preset current conversion relation when the current value is smaller than the first preset threshold, in which, the first preset threshold is an initial overcurrent set value of the chip, and the second preset threshold is no greater than the first preset threshold; and a controller 50, configured to maintain the initial overcurrent set value constant when the current value is no smaller than the first preset threshold.

In one embodiment, the correction device of the present embodiment is configured to correct the overcurrent set value of the chip. Particularly, the current detector 20 is configured to detect the current value of the output current signal of the chip, and the detection includes acquisition and conversion process, that is, the acquired current signal is converted into the voltage value. The current comparator 30 is configured to compare the detected current value and the first preset threshold and determine whether or not the current value is smaller than a first preset threshold. The overcurrent set circuit 40 is configured to correct the overcurrent set value of the chip to a second preset threshold corresponding to the current value according to the preset current conversion relation when the current value is smaller than the first preset threshold, particularly, the first preset threshold is the initial overcurrent set value of the chip, the actual overcurrent value of the chip may be different due to deviation of the manufacturing process, but the respective chip is provided with a unified initial overcurrent set value at the factory, and generally, the initial overcurrent set value is relatively large. Therefore, the second preset threshold after correction is not greater than the first preset threshold. When the current signal outputted by the chip is relatively small, the actual overcurrent value of the chip may be relatively small. The actual overcurrent value is an overcurrent value, which would result in damage once being exceeded by the current output by the chip.

In one embodiment, when the current value of the current signal output by the chip is smaller than the first preset threshold, the overcurrent set value of the chip will be corrected to the second preset threshold corresponding to the current value according to the preset current conversion relation. Particularly, the preset current conversion relation can be set according to user's needs.

In one embodiment, the preset current convention relation comprises: setting the second preset threshold to be the current value of the current signal output by the chip plus a preset value. For example, if the first preset threshold is 100 mA, the detected current value of the current signal is 10 mA, and the preset value set by the user is 20 mA, then the second preset threshold will be 30 mA according to the preset current conversion relation.

In one embodiment, the preset current conversion relation may also be a linear relation. For example, when the current value of the current signal is smaller than the first preset threshold, the second preset threshold is set to be 1.1 folds or 1.2 folds of the current value.

In one embodiment, the preset current conversion relation may also be calculated by a preset algorithm according to the user's needs, or may comprise setting the second preset threshold which is in correspondence with the current value of the current signal output by the chip in a pre-stored current lookup table.

Figure 6:
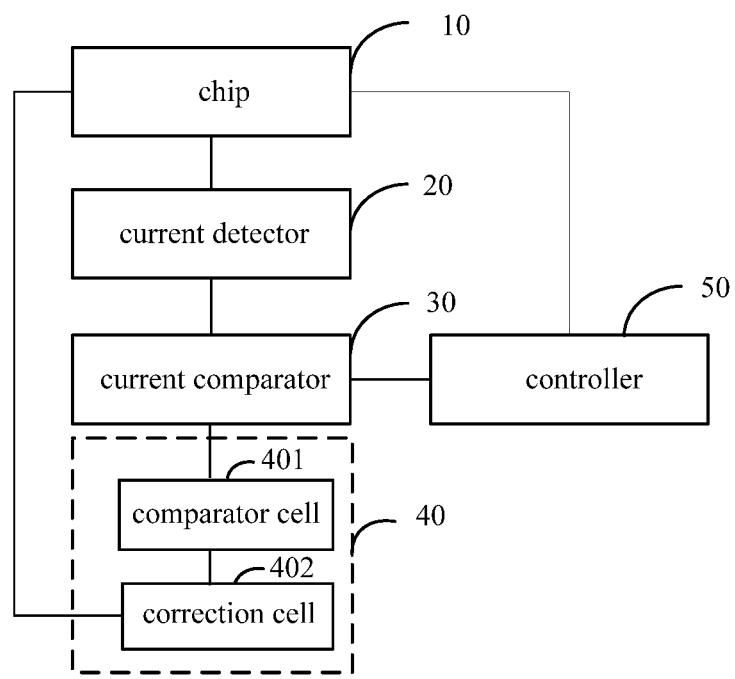
FIG. 6 is a schematic structural diagram of a correction method according to another embodiment of the present application.

FIG. 6 is a structural diagram of a correction device provided by another embodiment of the present application.

As shown in FIG. 6, the overcurrent set circuit 40 comprises:

a comparator cell 401, configured to determine a threshold interval where the current value is located when the current value is smaller than the first preset threshold; and a correction cell 402, configured to acquire the overcurrent set value corresponding to the threshold interval and correct the overcurrent set value of the chip to the overcurrent set value corresponding to the threshold interval.

In one embodiment, when the current value of the current signal output by the chip 10 is smaller than the first preset threshold, the threshold interval where the current value is located is determined by the comparator 401, For example, the first preset threshold is 100 mA, each threshold interval is defined by an interval of 10 mA, and therefore 10 threshold intervals are divided from 0 to 100 mA, the ten threshold intervals may correspond to 10 second preset thresholds which may be identical or different. For example, all the second preset thresholds corresponding to the threshold intervals of between 70 mA and 80 mA, between 80 mA and 90 mA, and between 90 mA and 100 mA may be 100 mA, the second preset threshold corresponding to the threshold interval of between 50 mA and 60 mA may be 80 mA, and so on. When the current of the current signal is detected to be smaller than the first preset threshold, the threshold interval where the current value is located is determined, for example, if the current of the current signal is detected to be 55 mA, then the overcurrent set value of the chip is corrected to 80 mA according to that the second preset threshold corresponding to the threshold interval of between 50 mA and 60 mA is 80 mA.

In one embodiment, the correction cell 402 is further configured to skip the correction of the initial overcurrent set value of the chip when the threshold interval where the current value output by the chip 10 is located is a preset safety threshold interval.

In one embodiment, if the threshold interval where the current value of the current signal is located is a preset safety threshold interval, the correction of the initial overcurrent set value of the chip 10 is skipped. For example, the preset safety threshold interval is between 60 mA and 100 mA, when the detected current signal is 70 mA, the initial overcurrent set value of the chip will not be corrected.

In one embodiment, the current detector 20 is further configured to convert the current signal into a digital signal to obtain the current value of the current signal.

In one embodiment, the detection of the current value of the current signal output by the chip 10 may comprise the acquisition process and conversion process. When the current signal output by the chip is acquired, the current signal of the current signal is obtained by converting the current signal into the digital signal, so as to be compared with the pre-stored first current threshold.

In one embodiment, the overcurrent set circuit 40 is further configured to:

search a table of correspondence relation between a pre-stored current value and the overcurrent set value when the current value is smaller than the first preset threshold, acquire the overcurrent set value corresponding to the current value of the current signal, and correct the overcurrent set value of the chip to the overcurrent set value corresponding to the current value of the current signal.

FIG. 4 is a table of correspondence relation between the pre-stored current value and the overcurrent set value provided by one embodiment of the present application, that is, a current lookup table preset by the user. Particularly, the user presets overcurrent set values corresponding to the current values that are smaller than the first preset threshold. When the current value of the current signal output by the chip is detected, the overcurrent set value corresponding to the current value is acquired based on the current value and the table of correspondence relation between the current value of the current signal and the overcurrent set value. The table of correspondence relation between the current value of the current signal and the overcurrent set value can be stored in a storage medium, and the corresponding acquisition process may be the reading of the overcurrent set value corresponding to the current value in the storage medium.

In one embodiment, after the overcurrent set value corresponding to the current value is acquired, the acquired overcurrent set value is set to be the overcurrent set value of the chip, that is, the initial overcurrent set value of the chip is corrected to the acquired overcurrent set value corresponding to the current value.

In one embodiment, the controller 50 is further configured to: control the chip to stop outputting the current signal when the current value of the current signal is no smaller than the initial overcurrent set value.

In one embodiment, the controller is further configured to: control the chip to stop outputting the current signal when the current value of the current signal is no smaller than the first preset threshold.

One embodiment of the present application further provides a display device. The display device comprises:
a display panel;
a driver circuit; and
a correction device.

The driver circuit comprises a level shifter IC configured to output a current signal, and the display panel is provided with a shifter register configured to receive a current output signal output from the level shifter IC for diving the display panel; and the correction device comprises:
a current detector 20, configured to detect a current value of a output current signal of a chip 10;
a current comparator 30, configured to determine whether or not the current value is smaller than a first preset threshold;
an overcurrent set circuit 40, configured to correct an overcurrent set value of the chip to a second preset threshold corresponding to the current value of the current signal according to a preset current conversion relation when the current value is smaller than the first preset threshold, in which, the first preset threshold is an initial overcurrent set value of the chip, and the second preset threshold is no greater than the first preset threshold; and
a controller 50, configured to maintain the initial overcurrent set value constant when the current value is no smaller than the first preset threshold.

In one embodiment, the chip 10 is the level shifter IC.

In one embodiment, the display device may be any type of display device provided with the above-mentioned correction device, such as a liquid crystal display (LCD), an organic electroluminescence display (OLED) device, a quantum dot light emitting diode (QLED) display device, or a curved display device, or the like.

In one embodiment, the display panel includes a pixel array consisting of a plurality of rows of pixels and a plurality of columns of pixels.

In one embodiment, the correction device of the present embodiment is configured to correct the overcurrent set value of the chip. Particularly, the current detector 20 is configured to detect the current value of the output current signal of the chip, and the detection includes acquisition and conversion process, that is, the acquired current signal is converted into the voltage value. The current comparator 30 is configured to compare the detected current value and the first preset threshold and determine whether or not the current value is smaller than a first preset threshold. The overcurrent set circuit 40 is configured to correct the overcurrent set value of the chip to a second preset threshold corresponding to the current value according to the preset current conversion relation when the current value is smaller than the first preset threshold, particularly, the first preset threshold is the initial overcurrent set value of the chip, the actual overcurrent value of the chip may be different due to deviation of the manufacturing process, but the respective chip is provided with a unified initial overcurrent set value at the factory, and generally, the initial overcurrent set value is relatively large. Therefore, the second preset threshold after correction is not greater than the first preset threshold. When the current signal outputted by the chip is relatively small, the actual overcurrent value of the chip may be relatively small. The actual overcurrent value is an overcurrent value, which would result in damage once being exceeded by the current output by the chip.

In one embodiment, when the current value of the current signal output by the chip is smaller than the first preset threshold, the overcurrent set value of the chip will be corrected to the second preset threshold corresponding to the current value according to the preset current conversion relation. Particularly, the preset current conversion relation can be set according to user's needs.

In one embodiment, the preset current convention relation comprises: setting the second preset threshold to be the current value of the current signal output by the chip plus a preset value. For example, if the first preset threshold is 100 mA, the detected current value of the current signal is 10 mA, and the preset value set by the user is 20 mA, then the second preset threshold will be 30 mA according to the preset current conversion relation.

In one embodiment, the preset current conversion relation may also be a linear relation. For example, when the current value of the current signal is smaller than the first preset threshold, the second preset threshold is set to be 1.1 folds or 1.2 folds of the current value.

In one embodiment, the preset current conversion relation may also be calculated by a preset algorithm according to the user's needs, or may comprise setting the second preset threshold which is in correspondence with the current value of the current signal output by the chip in a pre-stored current lookup table.

FIG. 6 is a structural diagram of a correction device provided by another embodiment of the present application.

As shown in FIG. 6, the overcurrent set circuit 40 comprises:
a comparator cell 401, configured to determine a threshold interval where the current value is located when the current value is smaller than the first preset threshold; and
a correction cell 402, configured to acquire the overcurrent set value corresponding to the threshold interval and correct the overcurrent set value of the chip to the overcurrent set value corresponding to the threshold interval.

In one embodiment, when the current value of the current signal output by the chip 10 is smaller than the first preset threshold, the threshold interval where the current value is located is determined by the comparator 401, For example, the first preset threshold is 100 mA, each threshold interval is defined by an interval of 10 mA, and therefore 10 threshold intervals are divided from 0 to 100 mA, the ten threshold intervals may correspond to 10 second preset thresholds which may be identical or different. For example, all the second preset thresholds corresponding to the threshold intervals of between 70 mA and 80 mA, between 80 mA and 90 mA, and between 90 mA and 100 mA may be 100 mA, the second preset threshold corresponding to the threshold interval of between 50 mA and 60 mA may be 80 mA, and so on. When the current of the current signal is detected to be smaller than the first preset threshold, the threshold interval where the current value is located is determined, for example, if the current of the current signal is detected to be 55 mA, then the overcurrent set value of the chip is corrected to 80 mA according to that the second preset threshold corresponding to the threshold interval of between 50 mA and 60 mA is 80 mA.

In one embodiment, the correction cell 402 is further configured to skip the correction of the initial overcurrent set value of the chip when the threshold interval where the current value output by the chip 10 is located is a preset safety threshold interval.

In one embodiment, if the threshold interval where the current value of the current signal is located is a preset safety threshold interval, the correction of the initial overcurrent set value of the chip 10 is skipped. For example, the preset safety threshold interval is between 60 mA and 100 mA, when the detected current signal is 70 mA, the initial overcurrent set value of the chip will not be corrected.

The above description is only the optional embodiments of the present application, and is not intended to limit the present application. Any modifications, equivalent substitutions, and improvements made within the spirit and principles of the present application are included in the protection scope of the present application.

What is claimed is:

1. A correction method, comprising:
    detecting a current value of a output current signal of a chip;
    determining whether or not the current value is smaller than a first preset threshold; and
    correcting an overcurrent set value of the chip to a second preset threshold corresponding to the current value according to a preset current conversion relation if the current value is smaller than the first preset threshold, wherein the preset current conversion relation comprises setting the second preset threshold to be 1.1 folds or 1.2 folds of the current value of the current signal output by the chip, the first preset threshold is an initial overcurrent set value of the chip, and the second preset threshold is no greater than the first preset threshold; or
    maintaining the initial overcurrent set value constant if the current value is no smaller than the first preset threshold.

2. The correction method of claim 1, wherein the preset current conversion relation comprises:
    setting the second preset threshold to be the current value of the current signal output by the chip plus a preset value.

3. The correction method of claim 1, wherein the preset current conversion relation comprises:
    setting the second preset threshold which is in correspondence with the current value of the current signal output by the chip in a pre-stored current lookup table.

4. The correction method of claim 1, wherein the operation of correcting the overcurrent set value of the chip to the second preset threshold corresponding to the current value according to the preset current conversion relation comprises:
    determining a threshold interval where the current value is located; and
    acquiring the overcurrent set value corresponding to the threshold interval, and correcting the overcurrent set value of the chip to the overcurrent set value corresponding to the threshold interval.

5. The correction method of claim 4, wherein if the threshold interval where the current value of the current signal is located is a preset safety threshold interval, the correction of the initial overcurrent set value of the chip is skipped.

6. The correction method of claim 1, wherein the operation of detecting the current value of the current signal output by the chip comprises:
    converting the current signal into a digital signal to obtain the current value of the current signal.

7. The correction method of claim 1, wherein the operation of correcting the overcurrent set value of the chip to the second preset threshold corresponding to the current value according to the preset current conversion relation comprises:
    searching a table of correspondence relation between a pre-stored current value and the overcurrent set value to acquire the overcurrent set value corresponding to the current value of the current signal; and
    correcting the overcurrent set value of the chip to the overcurrent set value corresponding to the current value of the current signal.

8. The correction method of claim 1, wherein the operation of maintaining the initial overcurrent set value of the chip constant further comprises:
    controlling the chip to stop outputting the current signal.

9. A correction device, comprising:
    a current detector, configured to detect a current value of a output current signal of a chip;
    a current comparator, configured to determine whether or not the current value is smaller than a first preset threshold;
    an overcurrent set circuit, configured to correct an overcurrent set value of the chip to a second preset threshold corresponding to the current value of the current signal according to a preset current conversion relation when the current value is smaller than the first preset threshold, wherein the preset current convention relation comprises setting the second preset threshold to be 1.1 folds or 1.2 folds of the current value of the current signal output by the chip, the first preset threshold is an initial overcurrent set value of the chip, and the second preset threshold is no greater than the first preset threshold; and
    a controller, configured to maintain the initial overcurrent set value constant when the current value is no smaller than the first preset threshold.

10. The correction device of claim 9, wherein the preset current convention relation comprises:
    setting the second preset threshold to be the current value of the current signal output by the chip plus a preset value.

11. The correction device of claim 9, wherein the preset current convention relation comprises:
    setting the second preset threshold which is in correspondence with the current value of the current signal output by the chip in a pre-stored current lookup table.

12. The correction device of claim 9, wherein the overcurrent set circuit comprises:
    a comparator cell, configured to determine a threshold interval where the current value is located when the current value is smaller than the first preset threshold; and
    a correction cell, configured to acquire the overcurrent set value corresponding to the threshold interval and correct the overcurrent set value of the chip to the overcurrent set value corresponding to the threshold interval.

13. The correction device of claim 12, wherein the correction cell is further configured to skip the correction of the initial overcurrent set value of the chip when the threshold interval where the current value is located is a preset safety threshold interval.

14. The correction device of claim 9, wherein the current detector is further configured to convert the current signal into a digital signal to obtain the current value of the current signal.

15. The correction device of claim 9, wherein the overcurrent set circuit is further configured to:
search a table of correspondence relation between a pre-stored current value and the overcurrent set value when the current value is smaller than the first preset threshold, acquire the overcurrent set value corresponding to the current value of the current signal, and correct the overcurrent set value of the chip to the overcurrent set value corresponding to the current value of the current signal.

16. The correction device of claim 9, wherein the controller is further configured to:
control the chip to stop outputting the current signal when the current value of the current signal is no smaller than the first preset threshold.

17. The correction device of claim 9, wherein the controller is further configured to:
control the chip to stop outputting the current signal when the current value of the current signal is no smaller than the initial overcurrent set value.

18. A display device, comprising:
a display panel;
a driver circuit; and
a correction device;
wherein
the driver circuit comprises a level shifter IC configured to output a current signal, and the display panel is provided with a shifter register configured to receive a current output signal output from the level shifter IC for diving the display panel; and
the correction device comprises:
a current detector, configured to detect a current value of a output current signal of a chip;
a current comparator, configured to determine whether or not the current value is smaller than a first preset threshold;
an overcurrent set circuit, configured to correct an overcurrent set value of the chip to a second preset threshold corresponding to the current value of the current signal according to a preset current conversion relation when the current value is smaller than the first preset threshold, wherein the preset current convention relation comprises setting the second preset threshold to be 1.1 folds or 1.2 folds of the current value of the current signal output by the chip, the first preset threshold is an initial overcurrent set value of the chip, and the second preset threshold is no greater than the first preset threshold; and
a controller, configured to maintain the initial overcurrent set value constant when the current value is no smaller than the first preset threshold.

* * * * *